United States Patent
Yuan et al.

(10) Patent No.: US 6,403,489 B1
(45) Date of Patent: Jun. 11, 2002

(54) METHOD FOR REMOVING POLYMER STACKED ON A LOWER ELECTRODE WITHIN AN ETCHING REACTION CHAMBER

(75) Inventors: Tien-min Yuan, Taipei; Kuang-yung Wu, Chung Li; Shih-chi Lai; Kuo-tsai Kao, both of Hsin Chu, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 35 days.

(21) Appl. No.: 09/598,838

(22) Filed: Jun. 21, 2000

(30) Foreign Application Priority Data

Jan. 31, 2000 (TW) ........................................ 89101753 A

(51) Int. Cl.[7] ..................... H01L 21/302; B08B 7/00; B08B 5/04
(52) U.S. Cl. ............................ 438/706; 134/6; 134/21
(58) Field of Search ................... 134/1.1, 1.2, 1.3, 134/21, 6; 438/745, 706

(56) References Cited

U.S. PATENT DOCUMENTS

| | | | | |
|---|---|---|---|---|
| 5,180,467 A | * | 1/1993 | Cook et al. | 156/643 |
| 5,403,453 A | * | 4/1995 | Roth et al. | 204/164 |
| 5,486,235 A | * | 1/1996 | Ye et al. | 134/1.1 |
| 5,676,759 A | * | 10/1997 | Ye et al. | 134/1.2 |
| 5,952,060 A | * | 9/1999 | Ravi | 427/577 |
| 6,039,834 A | * | 3/2000 | Tanaka et al. | 156/345 |
| 6,079,426 A | * | 6/2000 | Subrahmanyam et al. | 134/1.1 |
| 6,125,859 A | * | 10/2000 | Kao et al. | 134/1.1 |

* cited by examiner

Primary Examiner—Benjamin L. Utech
Assistant Examiner—Matthew Anderson
(74) Attorney, Agent, or Firm—Bacon & Thomas

(57) ABSTRACT

An object of the invention is to provide a preventive maintenance for effectively removing polymer stacked on a lower electrode within a reaction chamber of etching equipment during the process of dry etching of a silicon oxide layer. First, the lower electrode is preferably set at 0° C., and then the reaction chamber is pre-cleaned preferably 20 times by a pump/purge cleaning manner. After the pre-cleaning, nitrogen or inert gas is supplied into the reaction chamber such that the internal pressure is equal to atmospheric pressure. Subsequently, the reaction chamber is opened preferably for 10 minutes, and the lower electrode is kept at 0° C. during this moment. Afterwards, the surface of the lower electrode is wiped by a piece of clean cloth to peel off the polymer. Finally, the lower electrode is preferably set at 25° C. and is wiped several times by using de-ionized water, isopropanol (IPA), ethanol, a solution of hydrogen peroxide in water, or Cleaner 5060 produced by the 3M corporation. According to the invention, the surface of the lower electrode does not suffer scratches and damage caused by a scraper. Therefore, the lifespan of the lower electrode is increased and the stability of the etching process is successfully enhanced.

7 Claims, 3 Drawing Sheets

METHOD FOR REMOVING POLYMER STACKED ON A LOWER ELECTRODE WITHIN AN ETCHING REACTION CHAMBER

BACKGROUND OF THE INVENTION

A. Field of the Invention

The invention relates to a preventive maintenance of etching equipment for the semiconductor technology. More particularly, the invention relates to a method for removing polymer stacked on a lower electrode within an etching reaction chamber.

B. Description of the Related Art

Along with progress of the fine processing technology, the degree of integration and the performance of semiconductor devices is gradually increasing. In the semiconductor manufacturing process, the primary function of the etching process is to remove layers on which there are no photoresist layers in the photolithography process, such that the mask patterns are transferred to the layers. In the above-mentioned etching process, there are two main methods: (1) the process of wet etching performed by a chemical reaction and (2) the process of dry etching performed by physical mechanisms. Compared with the process of wet etching, the process of dry etching takes a more important part in the fine processing technology due to anisotropic properties. In the physical mechanism of the process of dry etching, plasma is utilized to dissociate molecules of a reaction gas to reactive ions, and then the layers made of materials such as $SiO_2$, $Si_3N_4$, poly-Si, or Al alloy are removed by the bombardment of the reactive ions.

FIG. 1 is cross-sectional view showing the structure of etching equipment for performing the process of dry etching. Referring to FIG. 1, etching equipment 1 for performing the process of dry etching consists of an upper electrode 10, a lower electrode 20, a radio frequency generator 30, and a reaction chamber 70. In general, the upper electrode 10 is connected to the wall 40 of the reaction chamber 70, and both are grounded. In addition, the radio frequency generator 30 is connected to the lower electrode 20, and a wafer 50 to be etched is placed on the lower electrode 20. Referring to FIG. 2, the wafer 50 includes a substrate 51 on which a conductive, semiconductive, or insulating layer 52 is formed. A patterned photoresist layer 53 has been provided on the surface of the layer 52 by the process of photolithography before the wafer 50 is transferred into the reaction chamber 70. During the process of dry etching, a reaction gas (not shown) for carrying out dry etching is supplied into the reaction chamber 70 through a supply tube 60, and then is dissociated into ions by the radio frequency generator 30 to form a plasma. After the formation of the plasma within the reaction chamber 70, the plasma ions are accelerated by the electric potential difference between the upper electrode 10 and lower electrode 20 so as to bombard the exposed part 54 of the layer 52 formed on the surface of the substrate 51. Afterwards, the reaction product, as a result of the bombardment, is expelled through an exhaust tube 80 by a vacuum system (not shown) connected to the exhaust tube 80. Therefore, the transfer of the pattern from the photoresist layer 53 to the layer 52 is achieved.

In the manufacturing process of semiconductor devices, a layer made of silicon dioxide is usually applied as the insulating layer to be etched and the reaction gas for carrying out dry etching usually contains carbon and fluorine atoms. As a result, a polymer (not shown) including carbon and fluorine is produced by the chemical reaction between the reactive ions dissociated from the reaction gas and the silicon dioxide of the insulating layer. A part of the polymer stacks on the wall 40 of the reaction chamber 70 and the peripheral surface 90 of the lower electrode 20. After a period of time, the stacked polymer becomes the source of particle contamination and affects the yield of the wafer 50. In order to prevent the polymer from being stacked on the lower electrode 20 so as to make the process of dry etching effective, it is necessary to perform preventive maintenance of the reaction chamber 70 during intervals.

FIG. 3 is a plane view showing the structure of the lower electrode 20. Referring to FIG. 2, the polymer 100 adheres to the peripheral surface 90 of the lower electrode 20 in the form of a lump. The conventional preventive maintenance of the lower electrode 20 is to remove the polymer 100 adhering to the surface by the process of wet cleaning as described in the following.

At the beginning of the conventional preventive maintenance, the temperature of the lower electrode 20 is set to a room temperature. Then, the reaction chamber 70 is repeatedly cleaned several times by a pump/purge cleaning method. Next, the reaction chamber 70 is opened after the internal pressure of the reaction chamber 70 is up to atmospheric pressure by supplying nitrogen gas through the supply tube 60. Afterwards, using Cleaner 5060 (having as a main component $C_6F_{14}$), produced by the 3M corporation, as a cleaning solution, the surface of the lower electrode 20 is wiped several times. Furthermore, using a scraper (not shown), the polymer 100 adhering to the peripheral surface 90 of the lower electrode 20 is removed. Finally, the surface of the lower electrode 20 is wiped several times again by using Cleaner 5060 produced by the 3M corporation.

According to practical operations of the conventional preventive maintenance, it is necessary to use a large amount of Cleaner 5060 because the conventional method is not effective to remove the polymer 100 adhering to the peripheral surface 90 of the lower electrode 20. Moreover, it takes a long time to finish the conventional preventive maintenance due to the use of the scraper. The scraper also makes the surface of the lower electrode 20 worn and damaged resulting in a shortening of its lifespan, and therefore affects the stability of the etching process.

SUMMARY OF THE INVENTION

In view of the above problems and disadvantages, it is therefore an object of the invention to provide a method for removing polymer stacked on a lower electrode within an etching reaction chamber without the use of an additional cleaning solution or scraper.

The invention is an improvement over the conventional preventive maintenance of a lower electrode. Using the invention, the polymer stacked on the lower electrode is effectively removed, the cleaning time is shortened, the quantity of the required cleaning solution is decreased, and the lifespan of the lower electrode is increased.

According to the invention, a method for removing polymer stacked on a lower electrode within an etching reaction chamber comprises the following steps: setting a first temperature of the lower electrode in the range from −10° C. to 0° C., preferably 0° C.; cleaning the reaction chamber 5 to 50 times, preferably 20 times, by a pump/purge cleaning method; supplying at least one gas selected from a group consisting of nitrogen and an inert gas into the reaction chamber such that the internal pressure is equal to atmospheric pressure; opening the reaction chamber; keeping the reaction chamber open and the temperature of the lower electrode at 0° C. for 5 to 15 minutes, preferably 10 minutes; wiping the surface of the lower electrode with a piece of clean cloth; setting a second temperature of the lower electrode in the range from 20 to 30° C., preferably 25° C.; and wiping the surface of the lower electrode several times by using at least one cleaning solution selected from a group consisting of de-ionized water, isopropanol (IPA), ethanol, a solution of hydrogen peroxide in water, and Cleaner 5060 (having as a main component $C_6F_{14}$) produced by the 3M corporation.

BRIEF DESCRIPTION OF THE DRAWINGS

The objects, features, and advantages of the invention are clearly understood with reference to the preferred embodiment and the following drawings, wherein.

DETAILED DESCRIPTION OF THE PREFERRED EMBODIMENTS

The preferred embodiment according to the invention will now be described in detail referring to FIGS. 1 to 3.

Figure 2:
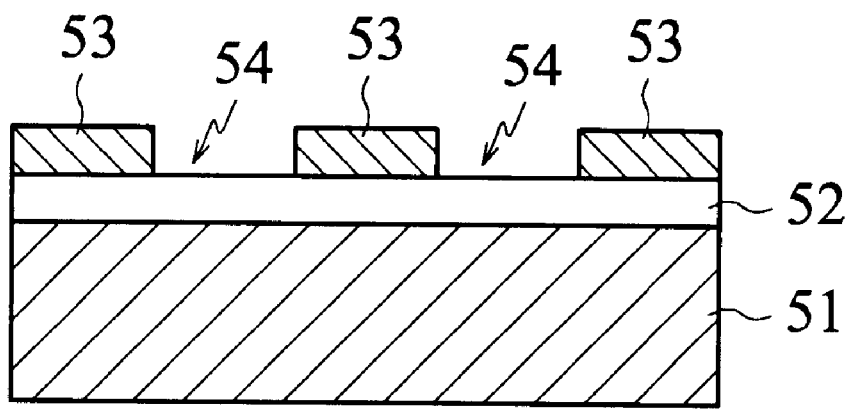
FIG. 2 is a cross-sectional view showing the structure of a wafer to be dry etched.
Figure 3:
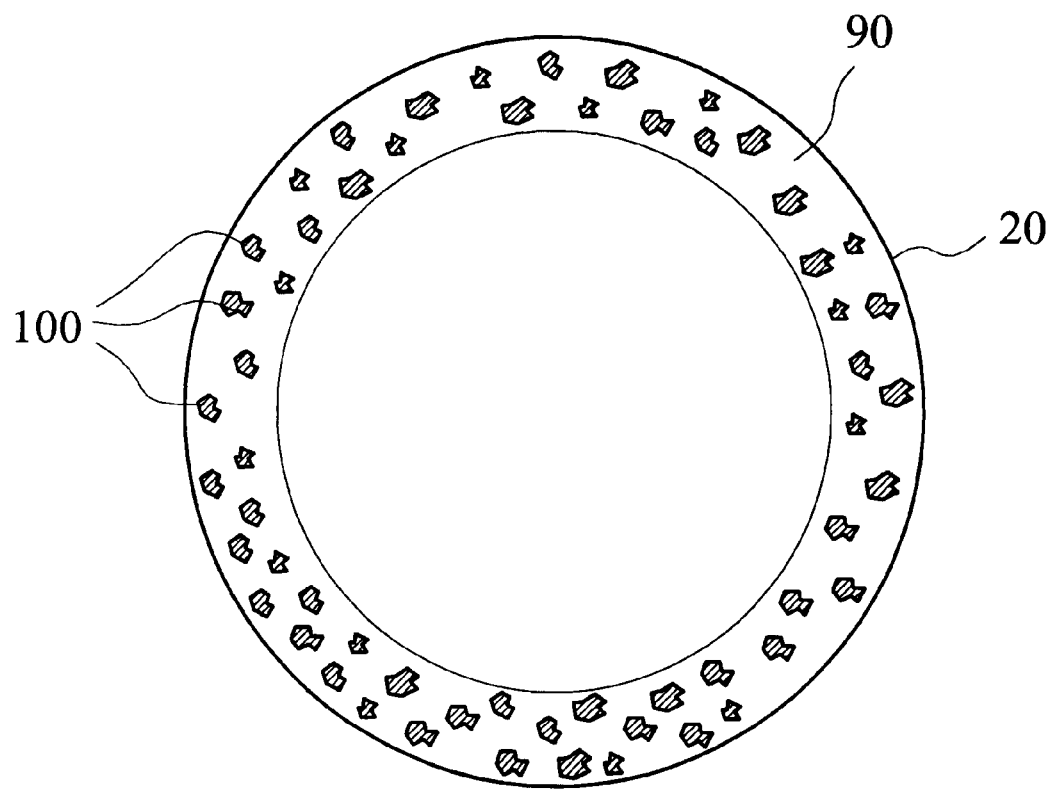
FIG. 3 is plane view showing polymer stacked on the peripheral surface of a lower electrode with an etching equipment reaction chamber for performing the process of dry etching.

During the process of dry etching, as mentioned above, a part of the polymer 100 produced by chemical reaction between silicon dioxide and the etching plasma stacks on the peripheral surface 90 of the lower electrode 20 in the form of a lump as shown in FIG. 2. As a method for effectively removing the polymer 100 stacked on the lower electrode 20, a preferred embodiment according to the invention comprises the following steps.

Figure 1:
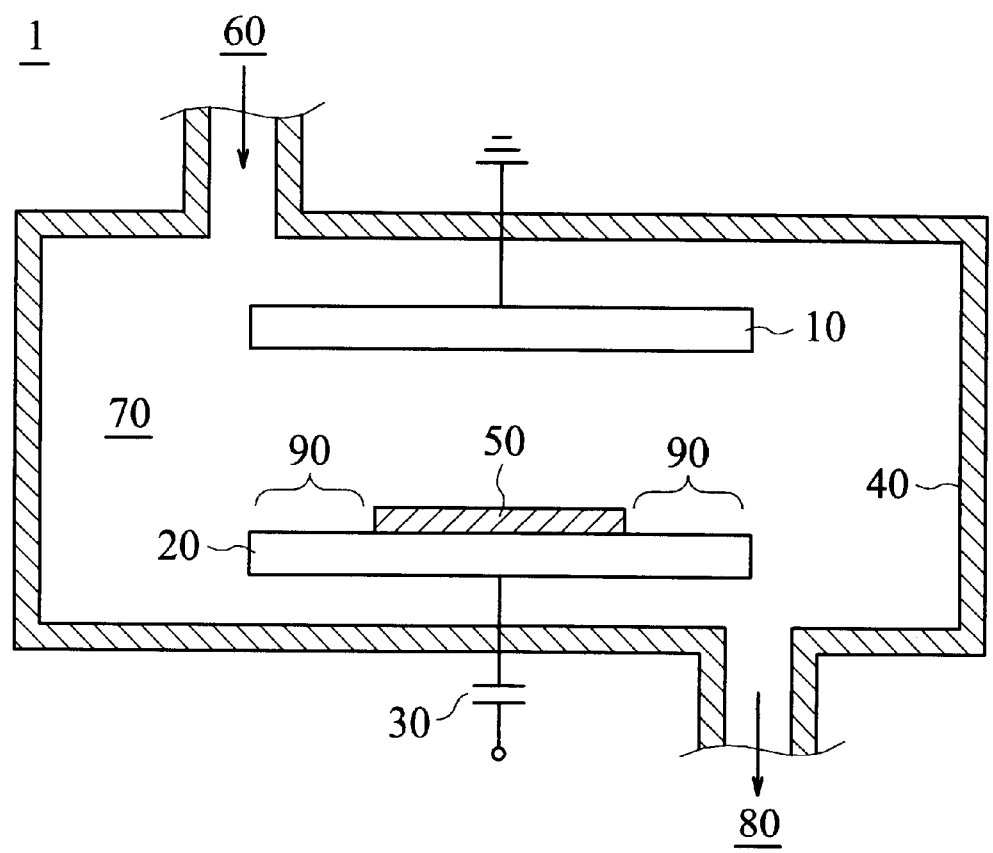
FIG. 1 is a cross-sectional view showing the structure of etching equipment for performing the process of dry etching.

Referring to FIG. 1, a first temperature T1 of the lower electrode 20 is set in the range from −10° C. to 0° C., preferably 0° C. Next, using a pump/purge cleaning method, the reaction chamber 70 is repeatedly cleaned 5 to 50 times, preferably 20 times in advance, in order to remove particles from grooves or joints (not shown) inside the reaction chamber 70. After pre-cleaning, at least one gas selected from a group consisting of nitrogen and an inert gas is supplied from the supply tube 60 into the reaction chamber 70 such that the internal pressure thereof is equal to atmospheric pressure, and then the reaction chamber 70 is opened.

The reaction chamber 70 is kept open for 5 to 15 minutes, preferably 10 minutes. During this period of time, the temperature of the lower electrode 20 is kept at 0° C. in order to make moisture above the lower electrode 20 condense into ice or water (not shown). Subsequently, using a piece of clean cloth, the surface of the lower electrode 20 is wiped several times to clean the ice. At this moment, the polymer 100 stacked on the peripheral surface 90 of the lower electrode 20 is easily peeled off together with the ice. Afterwards, the lower electrode 20 is set at a second temperature T2 in the range from 20° C. to 30° C., preferably 25° C., in order to prevent the moisture above the surface of the lower electrode 20 from condensing into ice. Finally, using at least one cleaning solution selected from a group consisting of de-ionized water, isopropanol (IPA), ethanol, a solution of hydrogen peroxide in water, and Cleaner 5060 (having as a main component $C_6F_{14}$) produced by the 3M corporation, the surface of the lower electrode 20 is wiped several times to completely remove the remaining polymer 100.

In the embodiment according to the invention, the surface of the lower electrode is not worn and damaged because the use of a scraper, as mentioned above in the conventional cleaning method, is unnecessary. Therefore, the invention successfully increases the lifespan of the lower electrode and enhances the stability of the etching process.

It should be noted that the TCP 9100-type etching equipment produced by Lam company and the DRM-type etching equipment produced by Tokyo Electron company are used in the preferred embodiment according to the invention. However, the invention is also applicable to the etching equipment produced by other companies and other etching equipment produced by Lam company and Tokyo Electron company for dry etching silicon oxide films. Besides, the invention is applicable to the etching equipment operating in the following modes: the plasma mode, the reactive ion etch mode, the magnetic enhanced reactive ion etch mode, and high density plasma mode.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for removing polymer stacked on a lower electrode within an etching reaction chamber comprising the following steps:

setting said lower electrode at a first temperature in the range from −10° C. to 0° C.;

cleaning said etching reaction chamber by a pump/purge cleaning manner;

supplying at least one gas into said etching reaction chamber such that the internal pressure thereof is equal to atmospheric pressure;

opening said etching reaction chamber;

keeping said etching reaction chamber open for a period of time;

wiping the surface of said lower electrode by a piece of clean cloth;

setting said lower electrode at a second temperature in the range from 20° C. to 30° C.; and wiping the surface of said lower electrode by using at least one cleaning solution.

2. A method according to claim 1, wherein said first temperature is 0° C.

3. A method according to claim 1, wherein said cleaning step is performed 5–50 times.

4. A method according to claim 1, wherein said at least one gas is selected from a group consisting of nitrogen and an inert gas.

5. A method according to claim 1, wherein said period of time is in the range from 5 to 15 minutes.

6. A method according to claim 1, wherein said second temperature is 25° C.

7. A method according to claim 1, wherein said at least one cleaning solution is selected from a group consisting of de-ionized water, isopropanol (IPA), ethanol, a solution of hydrogen peroxide in water, and Cleaner 5060 (having as a main component $C_6F_{14}$) produced by the 3M corporation.

* * * * *